United States Patent
Kuwayama et al.

[19]

[11] Patent Number: 6,125,798

[45] Date of Patent: Oct. 3, 2000

[54] MOTOR VEHICLE COOLING APPARATUS WITH ELECTRIC MOTOR SURGE CURRENT INHIBITOR

[75] Inventors: Masatoshi Kuwayama, Chiryu; Yasunobu Hirao, Toyokawa; Shigeru Takeuchi, Gamagori; Takafumi Ito, Kariya, all of Japan

[73] Assignee: Denso Corporation, Kariya, Japan

[21] Appl. No.: 09/200,263

[22] Filed: Nov. 25, 1998

[30] Foreign Application Priority Data

Nov. 26, 1997 [JP] Japan ................................. 9-324889

[51] Int. Cl.[7] ...................................................... F01P 7/02
[52] U.S. Cl. ........................................................ 123/41.12
[58] Field of Search .............................. 123/41.12, 41.49; 361/18

[56] References Cited

U.S. PATENT DOCUMENTS

| | | | |
|---|---|---|---|
| 4,765,284 | 8/1988 | Kanazawa et al. | 123/41.49 |
| 5,541,799 | 7/1996 | Schmidt et al. | 361/18 |
| 5,559,656 | 9/1996 | Chokhawala | 361/18 |
| 5,675,169 | 10/1997 | Hoshi et al. | 257/355 |

FOREIGN PATENT DOCUMENTS 3-264745  11/1991  Japan.

*Primary Examiner*—Thomas N. Moulis
*Attorney, Agent, or Firm*—Harness, Dickey & Pierce, PLC

[57] ABSTRACT

A cooling apparatus for automotive use wherein speed of an electric cooling fan is controlled solely at a predetermined speed. When a relay switch is switched on, voltage of a battery is applied to a lag circuit. Output of the lag circuit is applied to a gate G of a MOS transistor, but rise of the gate-applied voltage is delayed by the lag circuit according to a time constant thereof, and increases slowly. When the gate-applied voltage reaches the threshold voltage of the MOS transistor, the MOS transistor begins to switch on. However, when the gate-applied voltage is low, the drain current flowing through the MOS transistor is limited and thereby surge current at the motor is minimized.

12 Claims, 2 Drawing Sheets

SURGE-CURRENT REDUCING CIRCUIT

SURGE-CURRENT REDUCING CIRCUIT

MOTOR VEHICLE COOLING APPARATUS WITH ELECTRIC MOTOR SURGE CURRENT INHIBITOR

CROSS-REFERENCE TO RELATED APPLICATION

The present application is related to and claims priority in Japanese unexamined patent application Hei. 9-324889, the contents of which are incorporated herein by reference.

DETAILED DESCRIPTION OF THE INVENTION

1. Technical Field of the Invention

The present invention relates to a cooling apparatus for automotive use, and more particularly to a vehicle-mounted cooling apparatus that blows cooling air to a radiator and a condenser of an air conditioner, and that includes an electric motor surge current inhibiting device.

2. Related Art

A motor vehicle cooling apparatus that blows cooling air from an electric cooling fan through a radiator and a condenser for air-conditioning use is conventionally known. For example, an apparatus that performs pulse-width modulation control (PWM control, i.e., control of the duty cycle of voltage applied to an electric motor) of an electric cooling fan based on engine coolant water temperature or an on/off state of an air conditioner is well known. Also, an apparatus that toggles between two resistors to control an electric cooling fan's speed at high and low stages is known.

In each of the above-mentioned apparatuses, when an ignition switch or an accessory switch is switched on, the fan motor drives the electric cooling fan in accordance with a PWM control signal, and a switching unit such as a relay is actuated to drive the motor, and thus the electric cooling fan, when the temperature of engine coolant water reaches a predetermined temperature, or when the air conditioner is turned on.

When the fan is initially activated, the fan motor speed is low. Therefore, motor counter-electromotive force is small when voltage is applied to the motor winding. As a result, excessive surge current flows to the motor, causing vehicle headlights dim momentarily until the speed of the electric motor increases.

In an effort to overcome this problem, in the PWM control apparatus described above, the applied voltage duty cycle may be increased gradually when the electric motor is activated. As a result, the above-described problem may be avoided in a comparatively simple manner without greatly increasing the number of system components.

Also, with the above-described dual resistor-based apparatus, the current surge problem may be eliminated by initially setting the control function of the apparatus to a low value, and then subsequently to a high value, when the motor is running.

Additionally, an apparatus is known which, due to demand for lower cost, provides only an on-off switch between the vehicle battery and the electric motor to specifically control the motor speed when required, without linearly controlling the speed of the electric cooling fan via PWM control, or without controlling the speed in a stepwise manner, as described above.

However, when a control apparatus is structured in a low-cost manner as described above, it does not include a control function to variably control the electric motor speed. Therefore, such an apparatus has difficulty in responding to the abovedescribed surge current problem.

SUMMARY OF THE INVENTION

In view of the foregoing, it is an object of the present invention to overcome the above-described surge current problem by controlling operation of an electric cooling fan at a predetermined speed via a simple, inexpensive and easy to implement structure.

Accordingly, the present invention provides an electric motor supplied with electrical power from a vehicle-mounted battery, and a fan driven by the motor that blows cooling air through a vehicle-mounted heat exchanger, wherein the electric motor is driven only at a predetermined speed. Further, a MOS transistor disposed in a power-supply line from the battery to the electric motor drives the electric motor. A lag circuit delays a rise in voltage applied at the gate of the MOS transistor from the battery. As a result, because the delay circuit delays a rise in the voltage applied to the transistor gate, drain current rise at the MOS transistor is gradual, and thus surge current at the electric motor during starting thereof is reduced.

The lag circuit also switches off the MOS transistor when the surge current is smaller than a predetermined value and the speed of the electric motor is less than or equal to a predetermined speed by interrupting power supplied to the electric motor. The above phenomenon typically occurs when the electric motor is rotated by blown air pressure generated by vehicle movement.

The fan rotates due to blown air pressure caused by vehicle travel, even when the supply of power to the electric motor is interrupted. For this reason, the electric motor operates as a generator and generates induced voltage. When the speed of the electric motor, and thus the induced voltage, becomes high, the induced voltage becomes the gate voltage of the MOS transistor. Consequently, when the speed of the electric motor becomes high and the gate voltage reaches the transistor threshold voltage, the MOS transistor unilaterally switches on, and the lag circuit is not enabled, even when the power supply to the electric motor is interrupted. Therefore, a surge current reducing effect of the lag circuit is not obtained.

To avoid the above situation, according to the present invention, the MOS transistor switches off when the speed of the electric motor is operating at or below a predetermined speed. Herein, the predetermined speed is a speed at which counter-electromotive force at the electric motor is relatively large and the surge current is smaller than a predetermined value. Accordingly, the lag circuit functions at only times when surge current is most likely to occur.

PREFERRED EMBODIMENTS OF THE PRESENT INVENTION

A cooling apparatus for automotive use according to a first embodiment of the present invention will be described hereinafter with reference to FIG. 1, which is a system diagram of a motor vehicle cooling apparatus.

Figure 1:
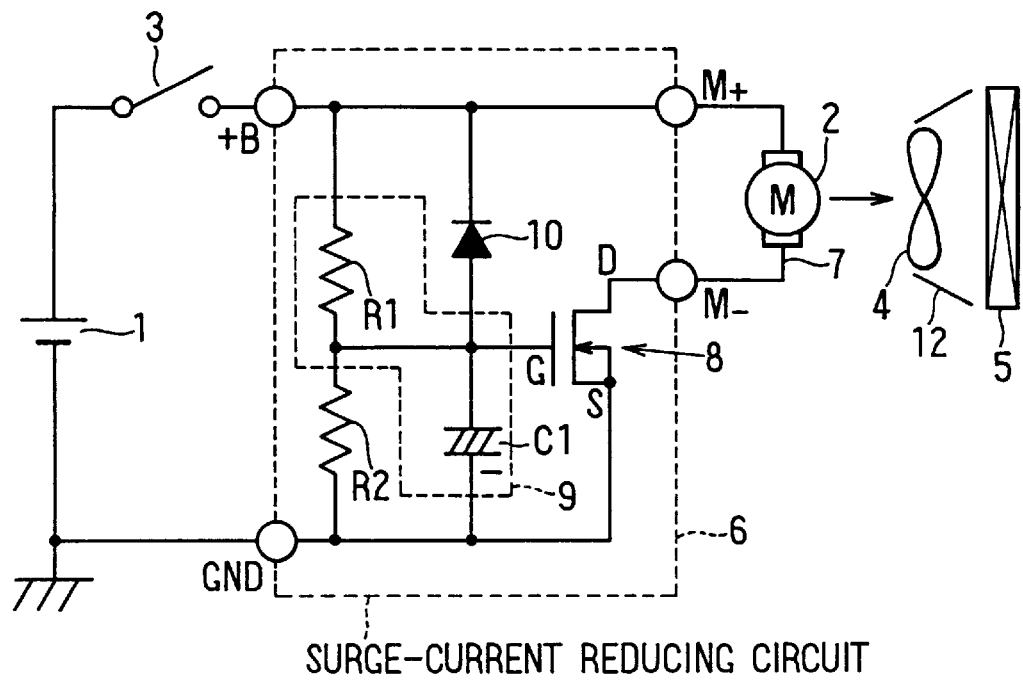
FIG. 1 is a system diagram of a first embodiment of the present invention.
Figure 2:
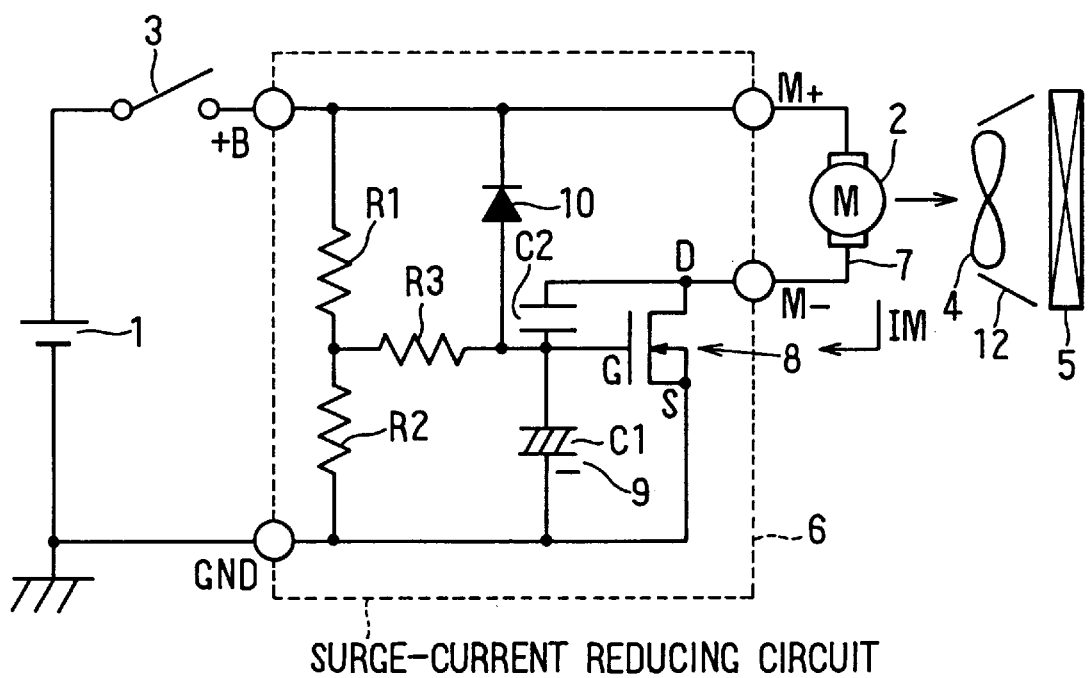
FIG. 2 is a system diagram of a second embodiment of the present invention.

In FIG. 1, a vehicle-mounted secondary battery 1, which is a typically a conventional 12 V battery, supplies current to an electric motor 2 (inductive negative charge, rated at 200 W). A relay switch 3 is disposed between the battery 1 and the electric motor 2. When the relay switch 3 is switched on, the battery 1 supplies power to the electric motor 2 to run the electric motor.

The relay switch 3 has a coil for drive use (not illustrated), and switches on when current flows to the coil and switches off when the current is interrupted. Interruption of coil energization is controlled by a vehicle control unit (not illustrated). A sensor (not illustrated) to detect the temperature of coolant water of an engine (not illustrated) inputs signals indicating coolant water temperature to the control unit.

When the sensor detection signal indicates that the coolant water has reached at least a predetermined temperature, and the controller determines that cooling of the engine-coolant water is necessary, the control unit switches on the coil and drives the electric motor 2. According to the present embodiment, both the electric motor 2, and a fan 4 for cooling use, are driven at only a predetermined speed when the relay switch 3 is switched on, as shown in the circuit of FIG. 1.

Still referring to FIG. 1, a radiator 5 for cooling use cools the engine coolant water. The electric motor 2 drives the above-mentioned fan 4, and cooling air generated by the fan 4 is blown through the radiator 5. The cooling air thus cools the engine coolant water flowing within the radiator 5. A fan shroud 12 guides the cooling air as the cooling air is sucked from the front surface of the radiator 5 due to the rotation of the fan 4.

A surge current reducing circuit 6, which is an essential portion of the present invention, will be described next. As shown in FIG. 1, the surge current reducing circuit 6 is connected between the battery 1 and the electric motor 2 by connectors (not illustrated-the circles in FIG. 1 represent connector pins).

The surge current reducing circuit 6 includes a MOS transistor 8, provided in a power-supply line 7 between the battery 1 and the electric motor 2, and a lag circuit 9. In the present embodiment, the MOS transistor 8 is preferably a trenchgate, enhancement-type field-effect transistor for driving the electric motor 2.

The lag circuit 9 includes a resistor-capacitor (RC) sub-circuit including a resistor R1 (240 k$\Omega$) and a capacitor C1 (100 $\mu$F). The resistor R1 and the capacitor C1 are connected in series between the +B electrode and the ground electrode of the battery 1. The point between the resistor R1 and the capacitor C1 is connected to the gate G of the MOS transistor 8. As a result, the lag circuit output becomes the gate voltage of the MOS transistor 8.

A resistor R2 (180 k$\Omega$) is connected in parallel with the capacitor C1 and in series with the resistor R1. Additionally, a diode 10 is connected in series with the capacitor C1 and in parallel with the resistor R1. The diode 10 is for rapidly draining the electrical charge accumulated between the drain D and the gate G of the MOS transistor 8, and for dependably switching the MOS transistor 8 when the relay switch 3 is switched from on to off.

Operation of the surge current reducing circuit 6 will be described next. First, when the relay switch 3 is switched on, the voltage of the battery 1 is applied to the lag circuit 9. The output of the lag circuit 9 is applied to the gate G of the MOS transistor 8. Because the rise of the gate-applied voltage is delayed by the lag circuit 9 according to the RC time constant thereof, the voltage therefore gradually increases. When the gate-applied voltage reaches the threshold voltage of the MOS transistor 8, the MOS transistor 8 begins to switch on. However, when the gate-applied voltage is low, the drain current flowing through the MOS transistor 8 is limited.

Consequently, the electric motor 2 is slowly activated, and its speed gradually rises. That is to say, the lag circuit 9 delays the rise of the drain current by delaying the rise of the gate-applied voltage of the MOS transistor 8 applied from the battery 1 during activation of the electric motor 2. Therefore, electric motor surge current is prevented. Additionally, because the electric motor 2 is activated slowly as described above, resulting noise generated by motor activation is reduced. The rise in the gate-applied voltage can be set as desired according to the above-mentioned RC time constant.

In the above embodiment, the MOS transistor 8 and the lag circuit 9 control the electric motor 2 at a single predetermined speed, and so the above-described surge current problem can be solved via an apparatus of simple structure.

Additionally, because structural components are simple, the apparatus size is comparatively small, and can be incorporated within the electric motor 2 or easily mounted on the fan shroud 12. Further, the MOS transistor 8 and the lag circuit 9 can be mounted so as to be cooled by the fan 4. Therefore, reliability of the surge current reducing circuit 6 is improved. Further, compactness of the cooling fan is possible, and cost can be reduced.

With the present embodiment, the surge current reducing circuit 6 can be connected between the battery 1 and the electric motor 2 by a connector without altering system wiring.

As shown in FIG. 1, the radiator 5 is disposed at a frontmost vehicle location to facilitate cooling thereof by blown air generated by vehicle travel, and so the fan 4 is preferably disposed just behind the radiator. Consequently, the blown air rotates the fan 4 and the electric motor 2 without the relay switch 3 switching on, even when the power supply to the electric motor 2 is interrupted.

When the blown air rotates the fan, the electric motor 2 functions as a generator and generates induced voltage between the positive pole M+ and the negative pole M−. When the speed of the electric motor 2 increases and the foregoing induced voltage becomes high, the gate-applied voltage of the MOS transistor 8 reaches the value of the induced voltage divided by the resistors R1, R2. Consequently, when the speed of the electric motor 2 rises and the gate-applied voltage becomes higher than the threshold voltage, the MOS transistor 8 unilaterally switches on even when the relay switch 3 is off and the lag circuit 8 is not enabled. A surge current reducing effect is therefore not obtained, even when the relay switch 3 is subsequently switched on during the above operational state.

However, the invention according to the present embodiment is structured so that the MOS transistor 8 does not switch on when the speed of the electric motor is at or below a predetermined speed (such as, for example, 1,500 rpm), the speed being dependent on the time constant of the lag circuit 9. Herein, 1,500 rpm is a speed at which the fan 4 rotates due to blown air pressure when the vehicle is traveling at 100 km/h. When the speed of the fan 4 is at or above 1,500 rpm, the counter-electromotive force at the electric motor 2 becomes relatively large, and surge current falls below a predetermined value (for example 25 A). Thus, the above-discussed surge current problem does not occur often, even when the relay switch 3 switches on and the electric motor 2 is driven.

Specific settings will be described hereinafter. With the present embodiment, when the speed of the electric motor 2 is, for example, 1,500 rpm, the above-described induced voltage is approximately 5 to 6 V. For this reason, when the induced voltage is taken to be 6 V, the gate-applied voltage is set by the voltage divider formed by the resistors 1, 2 (2.57 V in the above embodiment). The above voltage value is the voltage at which the drain current is restricted to or below the surge current according to the gate-voltage/drain-current characteristic of the MOS transistor 8. Additionally, depending on vehicle operating parameters, the MOS transistor 8 must be able to dependably drive the motor when the voltage of the battery 1 is taken to have dropped to 8 V.

Because of the above, the gate-applied voltage is determined by the voltage-dividing values of the resistors 1, 2. Therefore, it is necessary to set the respective resistor values so that the voltage drop (voltage between drain and source) assumes a value (with the embodiment, 0.5 V or less) when the MOS transistor 8 switches on does not cause problems in terms of product specifications, even when the voltage of the battery 1 falls to 8 V. Accordingly, with the present embodiment, the gate-applied voltage becomes 3.42 V due to the foregoing resistor values 240 kΩ and 180 kΩ, and so the above-described condition is fulfilled. Due to this, the lag circuit 6 functions at times that are determined to be necessary to inhibit surge current, and surge current can thus reliably be reduced during such times.

In the second embodiment, a capacitor C2 is interposed between the drain and the gate of the MOS transistor 8. Additionally, a resistor R3 is interposed between the resistor R1 and the capacitor C1. The capacitor C2 enlarges the charge capacitance between the drain and the gate of the MOS transistor 8. That is, as the charge capacitance of the capacitor C2 increases, the switching speed of the MOS transistor 8 decreases.

Accordingly, when the relay switch 3 is switched on, an electrical charge accumulates in the capacitor C1 between the gate and the source via the resistors R1 and R3. When the accumulated charge reaches a predetermined level, and thus the gate-source voltage reaches a threshold voltage of the MOS transistor 8, the transistor starts to turn on. At this time, a drain-source voltage of the transistor decreases, and, when it decreases below the gate-source voltage, an electrical charge accumulates in the capacitor C2. As a result, because the rise of the gate-source voltage is restricted, an increase in the transistor drain current can be limited.

Accordingly, in this embodiment, the number of components increases compared with the foregoing first embodiment. However, because the capacitance of the capacitor C1 can be reduced, circuit mounting advantages are realized.

Depending on the combination of the MOS transistor C1 and the resistor R1, blown air created by vehicle travel can generate the transistor gate voltage. Therefore, when the gate voltage rises gradually, the input/output oscillates due to the mirror effect of the transistor when it is initially turned on, and the voltage may thus be maintained near the gate threshold voltage. As a result, because the transistor is not turned on by the generated voltage, R2 may not be necessary, and circuit costs may be reduced.

Figure 3:
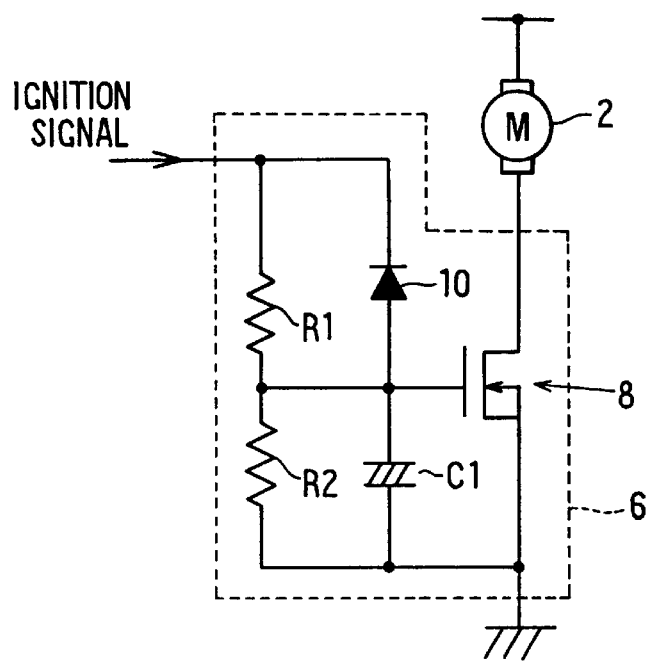
FIG. 3 is a system diagram of a third embodiment of the present invention.

Further, the circuit structure of the present apparatus may be modified as in the third embodiment of the present invention shown in FIG. 3. As was described in connection with the first embodiment shown in FIG. 1, the fan motor 2 is selectively energized and controlled via the relay 3. However, as shown in FIG. 3, energization and control of the fan motor 2 may also be based on the ignition switch signal, or other control signals.

Figure 4:
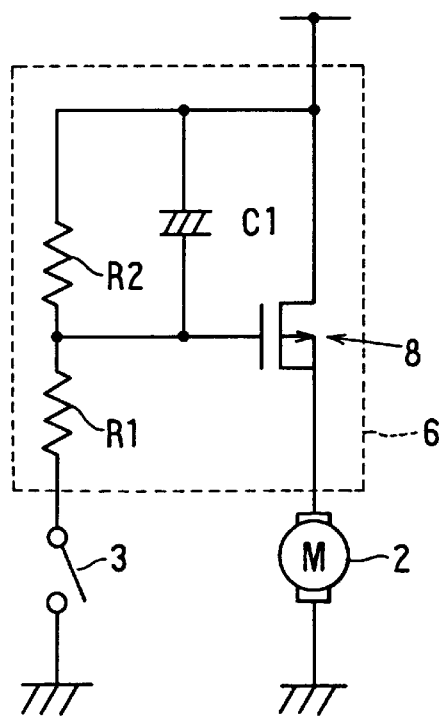
FIG. 4 is a system diagram of a fourth embodiment of the present invention.

In addition, as shown in FIG. 4, the fan motor 2 may alternatively be selectively energized and controlled by the MOS transistor 8, which in this embodiment is located at the upstream side of the motor.

While the above description constitutes the preferred embodiment of the present invention, it should be appreciated that the invention may be modified without departing from the proper scope or fair meaning of the accompanying claims. Various other advantages of the present invention will become apparent to those skilled in the art after having the benefit of studying the foregoing text and drawings taken in conjunction with the following claims.

What is claimed is:

1. A motor vehicle cooling system, comprising:
    an electric motor supplied with electrical power from a vehicle-mounted battery and driven only at a predetermined speed;
    a fan, driven by the electric motor, to blow cooling air through a vehicle-mounted heat exchanger;
    a MOS transistor disposed in a power-supply line between the battery and the electric motor, to drive the electric motor; and
    a lag circuit to delay a rise in voltage applied at a gate of the MOS transistor from the battery and thereby reduce a surge current of the electric motor during starting of the electric motor, said MOS transistor in an off state when said voltage supplied from said lag circuit to said gate is below a predetermined level, said MOS transistor in an on state when said voltage supplied from said lag circuit to said gate is above a predetermined level.

2. The system of claim 1, wherein the lag circuit switches off the MOS transistor when the surge current is less than a predetermined value and the electric motor operates at or below a predetermined speed.

3. The system of claim 2, wherein the lag circuit is operative to switch off the MOS transistor when the electric motor is rotated by moving vehicle-generated blown air and thereby generates induced voltage that enables the lag circuit to switch off the MOS transistor.

4. The system of claim 1, wherein the lag circuit comprises a resistor-capacitor circuit having a predetermined time constant that determines a delay in the rise in voltage at the gate of the MOS transistor.

5. The system of claim 1, wherein the lag circuit includes a capacitor interposed between the drain and source of the transistor to increase a delay caused by the lag circuit.

6. The system of claim 1, wherein the lag circuit includes a voltage divider that is operative to set the voltage applied to the gate of the MOS transistor.

7. A control apparatus for controlling an electric motor operative to drive a cooling fan for a vehicle-mounted heat exchanger, comprising:
    a MOS transistor to cause the motor to be selectively driven; and
    a lag circuit to delay a rise in voltage applied at a gate of said MOS transistor to thereby cause a gradual rise in drain current flow subsequent to a gate threshold voltage of the transistor being reached, and thereby minimize surge current at the electric motor upon activation of the motor, said MOS transistor in an off state when said voltage supplied from said lag circuit to said gate is below a predetermined level, said MOS transistor in an on state when said voltage supplied from said lag circuit to said gate is above a predetermined level.

8. The apparatus of claim 7, wherein the lag circuit switches off the MOS transistor when the surge current is less than a predetermined value and when the electric motor operates at or below a predetermined speed.

9. The apparatus of claim 8, wherein the lag circuit is operative to switch off the MOS transistor when the electric motor is rotated by vehicle-generated blown air and thereby generates induced voltage that enables the lag circuit to switch off the MOS transistor.

10. The apparatus of claim 7, wherein the lag circuit comprises a resistor-capacitor circuit having a predetermined time constant that determines a delay in the rise in voltage at the gate of the MOS transistor.

11. The apparatus of claim 7, wherein the lag circuit includes a capacitor interposed between the drain and source of the transistor to increase a time delay caused by the lag circuit.

12. The apparatus of claim 7, wherein the lag circuit includes a voltage divider that is operative to set the voltage applied to the gate of the MOS transistor.

* * * * *